(12) United States Patent
Togawa et al.

(10) Patent No.: US 11,648,638 B2
(45) Date of Patent: May 16, 2023

(54) SUBSTRATE POLISHING APPARATUS AND POLISHING LIQUID DISCHARGE METHOD IN SUBSTRATE POLISHING APPARATUS

(71) Applicant: Ebara Corporation, Tokyo (JP)

(72) Inventors: Tetsuji Togawa, Tokyo (JP); Kenichi Kobayashi, Tokyo (JP)

(73) Assignee: Ebara Corporation, Tokyo (JP)

( * ) Notice: Subject to any disclaimer, the term of this patent is extended or adjusted under 35 U.S.C. 154(b) by 484 days.

(21) Appl. No.: 16/638,711

(22) PCT Filed: Aug. 20, 2018

(86) PCT No.: PCT/JP2018/030613
§ 371 (c)(1),
(2) Date: Feb. 12, 2020

(87) PCT Pub. No.: WO2019/039419
PCT Pub. Date: Feb. 28, 2019

(65) Prior Publication Data
US 2020/0376625 A1 Dec. 3, 2020

(30) Foreign Application Priority Data
Aug. 21, 2017 (JP) .............................. JP2017-158473

(51) Int. Cl.
*B24B 37/04* (2012.01)
*B24B 57/02* (2006.01)
*H01L 21/306* (2006.01)

(52) U.S. Cl.
CPC ............ *B24B 37/042* (2013.01); *B24B 57/02* (2013.01); *H01L 21/30625* (2013.01)

(58) Field of Classification Search
None
See application file for complete search history.

(56) References Cited

U.S. PATENT DOCUMENTS 5,246,525 A 9/1993 Sato
7,585,205 B2 * 9/2009 Katsuoka ................ B24B 55/02
451/914
(Continued)

FOREIGN PATENT DOCUMENTS

CN 104968472 A 10/2015
JP H03-198332 A 8/1991
(Continued)

OTHER PUBLICATIONS

Japan Patent Office, International Search Report and the Written Opinion in International Application No. PCT/JP2018/030613 (dated Oct. 23, 2018).

*Primary Examiner* — Long Pham
(74) *Attorney, Agent, or Firm* — Leydig Voit and Mayer, Ltd.

(57) ABSTRACT

In a substrate polishing apparatus where a polishing liquid passes through inside a rotary joint, the rotary joint requires maintenance. There is provided a substrate polishing apparatus that includes: a polishing head for holding a substrate; a rotary table that has a surface to which a first opening portion is provided; a polishing liquid discharge mechanism disposed to the rotary table; and a controller configured to control at least the polishing liquid discharge mechanism. The polishing liquid discharge mechanism includes a first cylinder, a first piston, and a driving mechanism that drives the first piston. The first opening portion is communicated with a liquid holding space defined by the first cylinder and the first piston. The controller controls the driving of the first piston by the driving mechanism to increase and decrease a volume of the liquid holding space.

15 Claims, 14 Drawing Sheets

(56) References Cited

U.S. PATENT DOCUMENTS

2008/0085658 A1     4/2008   Katsuoka et al.
2015/0118944 A1     4/2015   Kosuge et al.

FOREIGN PATENT DOCUMENTS

| | | |
|---|---|---|
| JP | 2001-105301 A | 4/2001 |
| JP | 2004-082270 A | 3/2004 |
| JP | 2005-217002 A | 8/2005 |
| JP | 2007-118119 A | 5/2007 |
| JP | 2008-110471 A | 5/2008 |
| JP | 2017-013196 A | 1/2017 |
| KR | 2004-0040740 A | 5/2004 |
| KR | 10-2006-0070657 A | 6/2006 |

\* cited by examiner

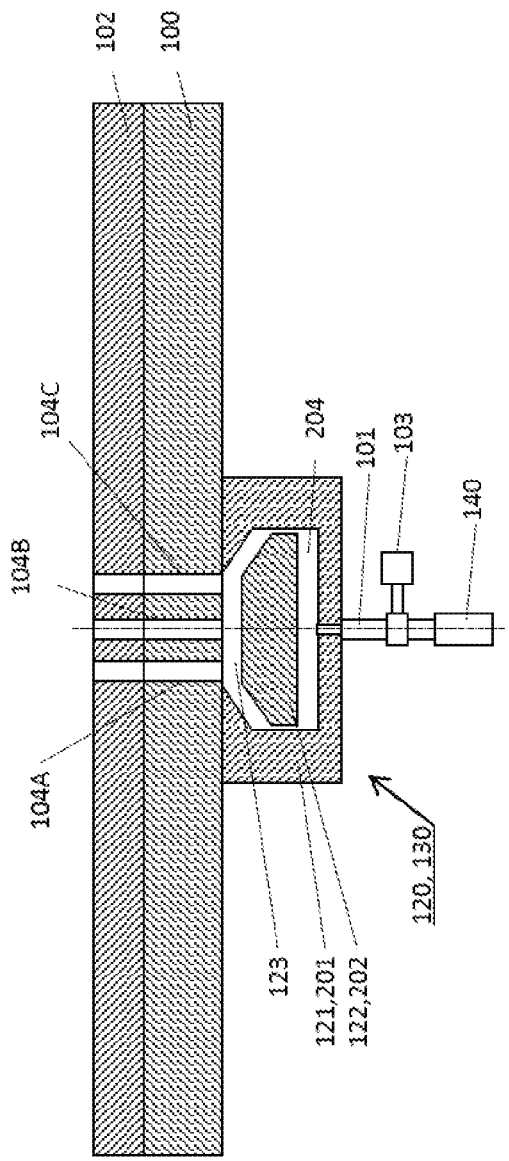
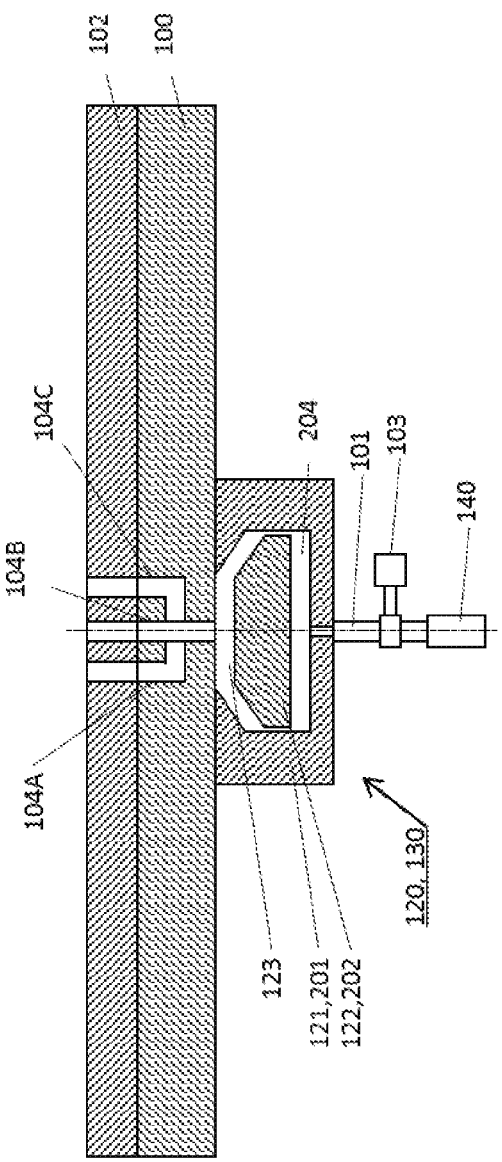

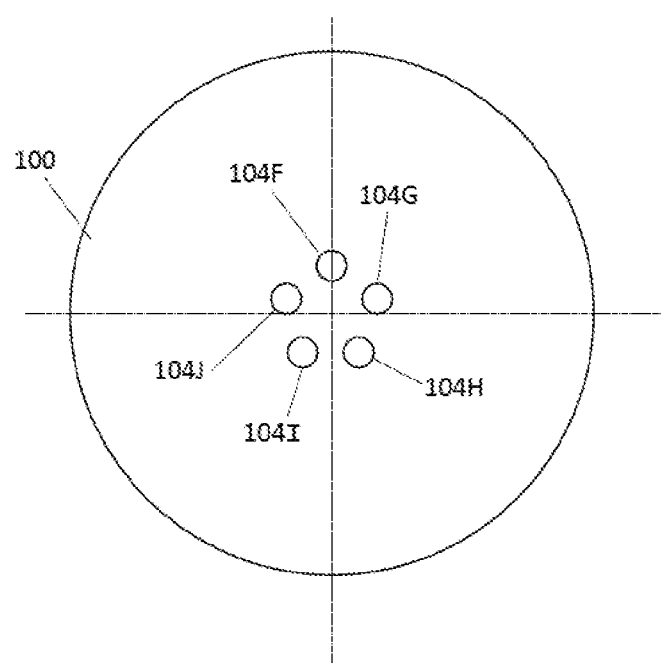

SUBSTRATE POLISHING APPARATUS AND POLISHING LIQUID DISCHARGE METHOD IN SUBSTRATE POLISHING APPARATUS

CROSS-REFERENCE TO RELATED APPLICATIONS

This patent application is the U.S. national phase of International Application No. PCT/JP2018/030613, filed Aug. 20, 2018, which claims the benefit of Japanese Patent Application No. 2017-158473, filed on Aug. 21, 2017, which are incorporated by reference in their entireties herein.

TECHNICAL FIELD

The present invention relates to a substrate polishing apparatus and a polishing liquid discharge method in the substrate polishing apparatus.

BACKGROUND ART

As one type of the substrate polishing apparatus used in a semiconductor processing operation, there has been a Chemical Mechanical Polishing (CMP) apparatus. In a typical CMP apparatus, a polishing pad is installed to a rotary table (platen), and a substrate is installed to a polishing head. The CMP apparatus rotates each of the rotary table and the polishing head while pressing the substrate to the polishing pad from above, thereby polishing the substrate. Usually, the polishing pad is supplied with a polishing liquid during the polishing of the substrate. A common polishing liquid for the CMP apparatus contains abrasive grains of $SiO_2$, $Al_2O_3$, and the like.

As one of methods for supplying the polishing liquid, there is a method to supply the polishing liquid from a lower portion of the table. Japanese Unexamined Patent Application Publication No. 2008-110471 (PTL 1) discloses a substrate polishing apparatus where a turntable includes a polishing liquid discharge port. In the substrate polishing apparatus disclosed in PTL 1, the polishing liquid is supplied via a rotary joint disposed downward the turntable.

CITATION LIST

Patent Literature

PTL 1: Japanese Unexamined Patent Application Publication No. 2008-110471

SUMMARY OF INVENTION

Technical Problem

In the device disclosed in PTL 1, the polishing liquid internally passes through the rotary joint. Therefore, components inside the rotary joint are possibly degenerated due to a chemical reaction with the polishing liquid, and in addition, the components inside the rotary joint are possibly abraded by abrasive grains contained in the polishing liquid. The degeneration and/or the abrasion of the components of the rotary joint not only possibly makes the supply of the polishing liquid unstable, but also possibly causes leakage of the polishing liquid. Accordingly, in the device disclosed in PTL 1, maintenance of the rotary joint is preferably performed regularly. However, for the maintenance, a material cost, labor costs, and the like for replacing the component are required. Since the operation of the device needs to be stopped during the maintenance work, the maintenance possibly decreases work efficiency of the device.

There is also a polishing liquid for the CMP apparatus that does not contain the abrasive grains (abrasive grainless polishing liquid). In this case, it is considered that the abrasion of the component due to the abrasive grains is not caused. However, even in the case of using the abrasive grainless polishing liquid, the degeneration of the component due to the reaction with the polishing liquid is possibly caused.

Accordingly, it is an object of this application to provide a substrate polishing apparatus and a polishing liquid discharge method in the substrate polishing apparatus to solve at least a part of the above-described problems.

Solution to Problem

This application discloses a substrate polishing apparatus as one embodiment. The substrate polishing apparatus includes: a polishing head for holding a substrate; a rotary table that has a surface to which a first opening portion is provided; a polishing liquid discharge mechanism disposed to the rotary table; and a controller configured to control at least the polishing liquid discharge mechanism. The polishing liquid discharge mechanism includes a first cylinder, a first piston, and a driving mechanism that drives the first piston. The first opening portion is communicated with a liquid holding space defined by the first cylinder and the first piston. The controller controls the driving of the first piston by the driving mechanism to increase and decrease a volume of the liquid holding space.

Furthermore, this application discloses a polishing liquid discharge method in a substrate polishing apparatus as one embodiment. The polishing liquid discharge method includes: a step of preparing a rotary table that includes a cylinder and a piston and has a surface to which an opening portion is provided for discharging a polishing liquid; a step of communicating with a liquid holding space and filling the polishing liquid in the liquid holding space from the opening portion, the liquid holding space being defined by the cylinder and the piston; and a step of discharging the polishing liquid from the opening portion by driving the piston to press the polishing liquid filled in the liquid holding space.

The substrate polishing apparatus and the polishing liquid discharge method in the substrate polishing apparatus provide an exemplary effect that the product life of the rotary joint can be extended because the polishing liquid does not pass through the rotary joint.

Furthermore, this application discloses the substrate polishing apparatus that includes a polishing liquid filling mechanism for filling a polishing liquid in the liquid holding space via the first opening portion as one embodiment.

The substrate polishing apparatus provides an exemplary effect that the polishing liquid can be filled in the liquid holding space.

Furthermore, this application discloses the substrate polishing apparatus where the driving mechanism includes a driving fluid supply mechanism that drives the first piston by a pressure of a driving fluid as one embodiment. Furthermore, this application discloses the substrate polishing apparatus where the driving mechanism includes a second cylinder and a second piston connected to the first piston, and the driving fluid supply mechanism is configured to drive the second piston by the pressure of the driving fluid to indirectly drive the first piston as one embodiment. Furthermore, this application discloses the substrate polishing apparatus where the driving fluid is a gas or a liquid as one embodiment. Furthermore, this application discloses the substrate polishing apparatus that includes a biasing mechanism that biases the first piston in an opposite direction of a direction in which the first piston is driven when the pressure of the driving fluid is increased as one embodiment. Furthermore, this application discloses the substrate polishing apparatus where the biasing mechanism is a spring as one embodiment. Furthermore, this application discloses the substrate polishing apparatus where the driving mechanism includes an electric driving mechanism as one embodiment.

The disclosure describes the driving mechanism in detail.

Furthermore, this application discloses the substrate polishing apparatus where the driving fluid is a gas or a liquid, the substrate polishing apparatus further includes a head up-and-down motion mechanism for pressing the substrate toward the rotary table, a second opening portion provided to the surface of the rotary table, a driving fluid supply line that communicates the driving fluid supply mechanism with the second opening portion, and a valve disposed on the driving fluid supply line, the valve being controlled by the controller, and the controller controls the valve to discharge the driving fluid from the second opening portion when the head up-and-down motion mechanism moves the polishing head upward as one embodiment.

The substrate polishing apparatus provides an exemplary effect that removal of the substrate from the polishing pad is facilitated.

Furthermore, this application discloses the substrate polishing apparatus that includes a sensor that measures a flow rate of the driving fluid or the pressure of the driving fluid, and the controller controls the driving mechanism based on a measurement value of the sensor as one embodiment.

The substrate polishing apparatus provides an exemplary effect that the discharge of the liquid can be precisely controlled.

Furthermore, this application discloses the substrate polishing apparatus that includes a rotary joint connected to the driving mechanism, and a power is supplied to the driving mechanism Via the rotary joint as one embodiment.

The disclosure describes the power supply in detail. Note that, since the power of the driving mechanism is, for example, a pneumatic, a hydraulic, or an electric power, abrasion of the rotary joint can be reduced.

Furthermore, this application discloses the substrate polishing apparatus where the polishing liquid discharge mechanism includes a cleaning liquid supply port communicated with the liquid holding space, the substrate polishing apparatus further includes a cleaning liquid supply line connected to the cleaning liquid supply port, the cleaning liquid supply line supplies a cleaning liquid to the liquid holding space passing through the cleaning liquid supply port, and the cleaning liquid is supplied from a cleaning liquid supply source as one embodiment.

The substrate polishing apparatus provides an exemplary effect that the holding and the discharge of the cleaning liquid by the polishing liquid discharge mechanism ensures the cleaning of the polishing pad, the substrate, and/or the liquid holding space.

Furthermore, this application discloses the substrate polishing apparatus where the rotary table is provided with a plurality of the first opening portions communicated with the identical liquid holding space as one embodiment. Furthermore, this application discloses the substrate polishing apparatus where a plurality of the polishing liquid discharge mechanisms are disposed as one embodiment.

These substrate polishing apparatus provide an exemplary effect that disposing a plurality of opening portions and/or polishing liquid discharge mechanisms ensures adjustment of the discharge of the liquid.

Furthermore, this application discloses the substrate polishing apparatus that further includes a storage configured to store a liquid discharge pattern, and the controller controls the driving mechanism based on the liquid discharge pattern as one embodiment.

The substrate polishing apparatus provides an exemplary effect that the liquid can be discharged based on a desired pattern.

Furthermore, this application discloses the polishing liquid discharge method where the step of filling the polishing liquid in the liquid holding space includes a step of supplying the polishing liquid to the opening portion from a position opposing the rotary table, and a step of driving the piston to increase a volume of the liquid holding space after the step of supplying the polishing liquid or in at least a part of a period in the step of supplying the polishing liquid as one embodiment.

The liquid filling method provides an exemplary effect that the filling of the liquid in the liquid holding space is facilitated even when the opening portion has a small diameter.

BRIEF DESCRIPTION OF DRAWINGS

FIG. 7A is a front cross-sectional view of a substrate polishing apparatus that includes a rotary table where three first opening portions communicated with an identical liquid holding space are provided.

FIG. 7B is a front cross-sectional view of the substrate polishing apparatus that includes the rotary table where the three first opening portions communicated with the identical liquid holding space are provided.

FIG. 9C is a top view of the rotary table where the five first opening portions are provided.

DESCRIPTION OF EMBODIMENTS

First Embodiment

Figure 1A:
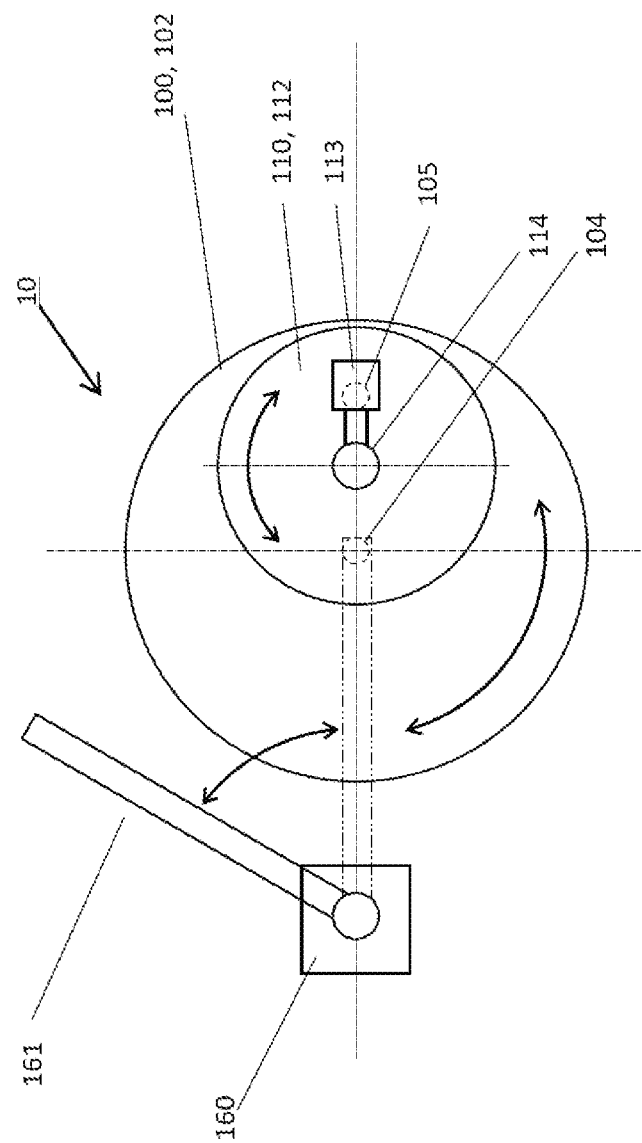
FIG. 1A is a top view of a substrate polishing apparatus that includes a polishing liquid discharge mechanism.
Figure 1B:
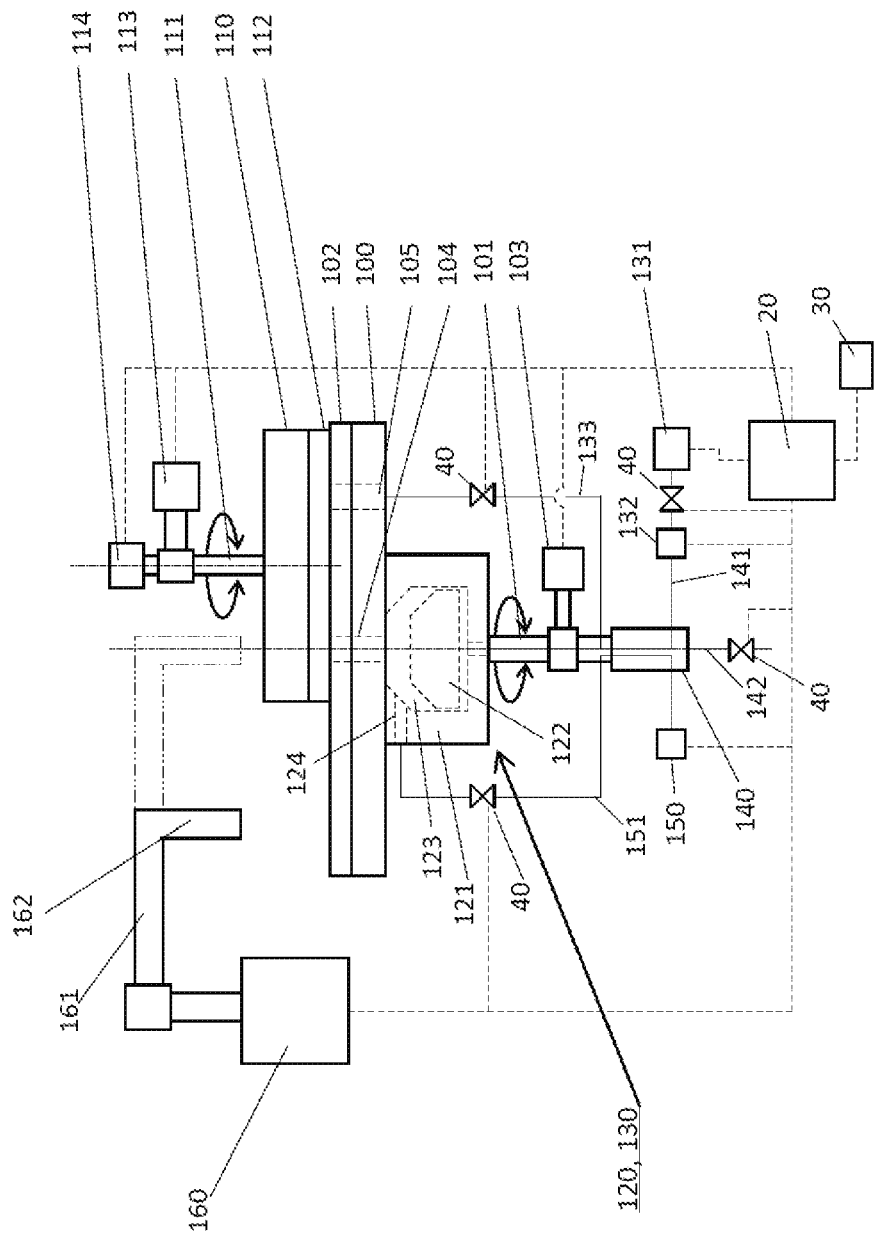
FIG. 1B is a front view of the substrate polishing apparatus that includes the polishing liquid discharge mechanism.

FIG. 1A is a top view of a substrate polishing apparatus 10 according to the first embodiment, and FIG. 1B is a front view. FIG. 1 and other drawings are drawings schematically illustrating components of the substrate polishing apparatus 10. Shapes, arrangements, sizes, and the like of the components in the respective drawings do not necessarily match with the shapes and the like of the actual device.

The substrate polishing apparatus 10 is a device that rotates both a rotary table 100 and a polishing head 110 while pressing a substrate 112 to a polishing pad 102, thereby polishing the substrate 112. Note that in the following description, a description will be given having a direction (downward direction on paper of FIG. 1B) in which the substrate 112 is pressed as a "downward direction" and its opposite direction as an "upward direction." However, the "upward direction" and the "downward direction" in this specification do not necessarily match a "vertically upward direction" and a "vertically downward direction." For example, when the entire substrate polishing apparatus 10 is installed to be inclined, the "upward direction" and the "downward direction" become the directions corresponding to the inclination of the substrate polishing apparatus 10.

(Rotary Table and Polishing Head)

The substrate polishing apparatus 10 includes the rotary table 100 rotated around a table rotation shaft 101 and a table rotation mechanism 103 that rotates the rotary table 100. To a top surface of the rotary table 100, the polishing pad 102 is replaceably installed. The substrate polishing apparatus 10 includes a controller 20 to control each component of the device, and a storage 30 to store conditions and the like for the control by the controller 20.

The substrate polishing apparatus 10 further includes the polishing head 110 and a head rotation mechanism 113 that rotates the polishing head 110 around a head rotation shaft 111. The polishing head 110 is disposed to be opposed to the rotary table 100, and the polishing head 110 has a bottom surface to which the substrate 112 is replaceably installed. In the example of FIG. 1, the center of rotation of the rotary table 100 does not match the center of rotation of the polishing head 110. However, the substrate polishing apparatus 10 may be configured so as to match the center of rotation of the rotary table 100 with the center of rotation of the polishing head 110. The substrate polishing apparatus 10 further includes a head up-and-down motion mechanism 114 that moves the polishing head 110 up and down. When polishing the substrate 112, the head up-and-down motion mechanism 114 moves the polishing head 110 to a lower portion, and presses the substrate 112 to the polishing pad 102. In other words, the head up-and-down motion mechanism 114 presses the substrate 112 toward the rotary table 100. When the polishing of the substrate 112 terminates, the head up-and-down motion mechanism 114 moves the polishing head 110 upward. The polished substrate is removed from the polishing head 110 at a retracted position (not illustrated) of the head, and a substrate to be polished next is handed over to the polishing head 110.

(First Opening Portion)

In an ordinary substrate polishing apparatus, a polishing liquid is supplied to a polishing pad from a nozzle disposed upward the polishing pad during the polishing of the substrate. However, in this method, the polishing liquid cannot be directly supplied to a part of the polishing pad in contact with the substrate (part where the polishing head is present). Accordingly, it is often difficult to uniformly supply the polishing liquid to an interface between the substrate and the polishing pad. The ordinary substrate polishing apparatus is often configured such that the polishing liquid is supplied to the center of the polishing pad, that is, a position close to the table rotation shaft, and the polishing liquid near the center of the polishing pad spreads on the polishing pad toward a peripheral portion by a centrifugal force. However, because of recent up-sizing of the substrate, the substrate covers the top of the table rotation shaft, and the polishing liquid cannot be supplied to the position close to the table rotation shaft in some cases (see FIG. 1). Not only in the case of supplying the polishing liquid, but also in a case of supplying a cleaning liquid, such as a pure water and a chemical liquid, to clean the substrate, similar problems exist.

Therefore, in this embodiment, the rotary table 100 includes a first opening portion 104. In the example of FIG. 1, the first opening portion 104 is provided in the center of the rotary table 100. Furthermore, a position of the polishing pad 102 corresponding to the first opening portion 104 when the polishing pad 102 is installed to the rotary table 100 is cut out. By discharging a liquid, such as the polishing liquid or the cleaning liquid, from the lower portion of the rotary table 100 via the first opening portion 104, those liquids can be supplied to also the part of the polishing pad 102 in contact with the substrate 112.

(Polishing Liquid Discharge Mechanism and Driving Mechanism)

To the lower portion of the rotary table 100, a polishing liquid discharge mechanism 120 that holds the polishing liquid to be discharged from the first opening portion 104 and is rotated with the rotary table 100 is disposed. The polishing liquid discharge mechanism 120 includes a cylinder 121 and a piston 122. The cylinder 121 and the piston 122 define a liquid holding space 123 to hold the liquid, such as the polishing liquid. The liquid holding space 123 is communicated with the first opening portion 104, and by increasing and decreasing a volume of the liquid holding space 123, the liquid can be discharged from the liquid holding space 123 via the first opening portion 104 and the liquid can be filled in the liquid holding space 123 via the first opening portion 104. The liquid holding space 123 is configured to form a sealed space excluding that the liquid holding space 123 is communicated with the first opening portion 104. Note that the term "cylinder" in this specification means a member or a portion configured to internally hold a fluid and has any shape. The cylinder 121 may be a member integrated with the rotary table 100. For example, a depressed portion is formed on the lower surface of the rotary table 100, and the depressed portion can be used as the cylinder 121. Conversely, the cylinder 121 may be a member independent of the rotary table 100.

The substrate polishing apparatus 10 further includes a driving mechanism 130 that drives the piston 122 to increase and decrease the volume of the liquid holding space 123. In the example of FIG. 1, the polishing liquid discharge mechanism 120 and the driving mechanism 130 are integrally configured.

As the driving mechanism 130, a mechanism that drives the piston 122 by a pressure of a driving fluid, typified by an air pressure system, a water pressure system, an oil pressure system, and the like, can be used. As the driving mechanism 130, an electric driving mechanism can be used. In the example of FIG. 1, the driving mechanism 130 is a mechanism that uses a driving fluid.

(Power Supply to Driving Mechanism)

The power of the driving mechanism 130 is supplied via a supply passage 141 of a rotary joint 140. The rotary joint 140 is disposed to a lower portion of the polishing liquid discharge mechanism 120. The power of the driving mechanism 130 is the driving fluid (gas, water, an oil, or the like) when the driving mechanism 130 uses the driving fluid, and is an electric power when the driving mechanism 130 is the electric driving mechanism.

In the example of FIG. 1, the driving mechanism 130 uses the driving fluid. Therefore, the driving mechanism 130 includes a driving fluid supply mechanism 131 that supplies the driving fluid. When the driving fluid supplied to the driving mechanism 130 needs to be discharged, the discharge is performed via a discharge passage 142 connected to the rotary joint 140. To control the supply and the discharge of the driving fluid, a valve 40 can be disposed to at least one of the supply passages 141 and the discharge passage 142. When the valve 40 is an electrically-operated valve, the valve 40 may be connected to the controller 20. When the electric driving mechanism is used as the driving mechanism 130, a power source connected to the electric driving mechanism may be disposed instead of the driving fluid supply mechanism 131.

Note that when a fluid cylinder, a battery, or the like are disposed to the rotary table 100, it is not necessary to dispose the rotary joint 140.

(Details of Polishing Liquid Discharge Mechanism and Driving Mechanism)

Figure 2:
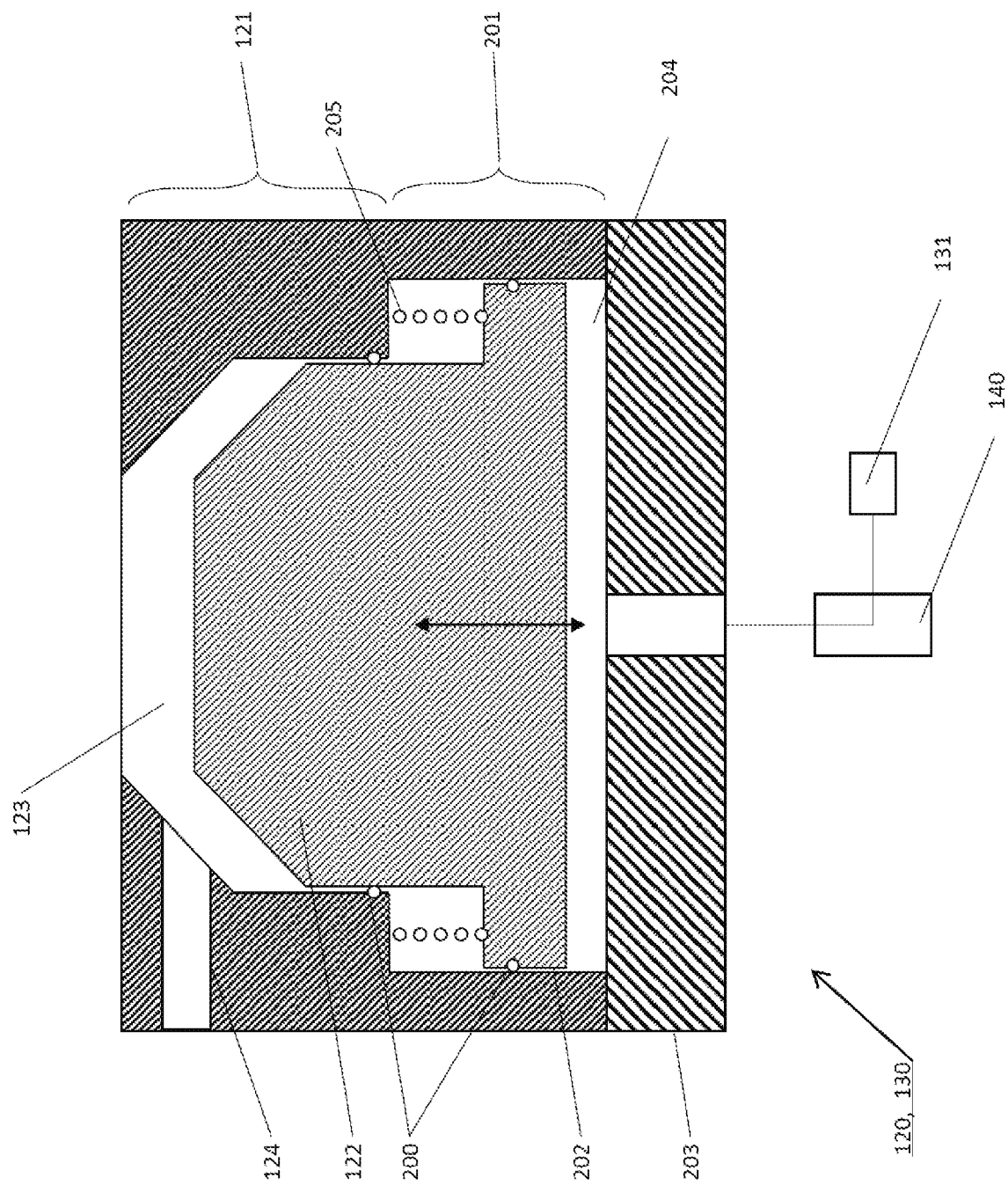
FIG. 2 is a front cross-sectional view of the polishing liquid discharge mechanism and a driving mechanism.

The polishing liquid discharge mechanism 120 and the driving mechanism 130 will be described in detail by referring to FIGS. 2, 3, 4, and 5. FIG. 2 is a front cross-sectional view of the polishing liquid discharge mechanism 120 and the driving mechanism 130. In the example of FIG. 2, the first cylinder 121 internally includes the first piston 122 movable up and down. A gap between the first cylinder 121 and the first piston 122 is sealed by an O-ring 200. That is, for the liquid holding space 123, the first piston 122 moves up and down, thereby increasing and decreasing the volume of the liquid holding space 123.

In the example of FIG. 2, the driving mechanism 130 uses the driving fluid. The driving mechanism 130 in the example of FIG. 2 includes a second cylinder 201 and a second piston 202 disposed inside the second cylinder to be movable up and down. However, in this example, the first cylinder 121 and the second cylinder 201 are integrally formed, and the first piston 122 and the second piston 202 are integrally formed. In other words, the second piston 202 is connected to the first piston 122. A gap between the second cylinder 201 and the second piston 202 is sealed by the O-ring 200. The driving mechanism 130 includes a bottom plate 203, and the second piston 202 and the bottom plate 203 define a fluid entering space 204. To the fluid entering space 204, the driving fluid supply mechanism 131 is connected via the rotary joint 140. Furthermore, the driving mechanism 130 may include a biasing mechanism that biases the first piston in an opposite direction of a direction in which the first piston 122 is driven when the pressure of the driving fluid is increased. In the example of FIG. 2, a spring 205 is used as the biasing mechanism. In the example of FIG. 2, the first piston 122 is driven upward when the pressure of the driving fluid is increased. Therefore, the spring 205 is configured to press the second piston 202 downward to bias the first piston 122 integrally formed with the second piston 202 downward.

The second piston 202 is driven to a position where a force of the driving fluid, which is supplied to the fluid entering space 204 by the driving fluid supply mechanism 131, to press up the second piston 202 is balanced with a force of the spring 205 to press down the second piston 202. Accordingly, by increasing and decreasing the pressure of the driving fluid, the second piston 202 can be moved up and down. Since the second piston 202 is integrally formed with the first piston 122, the first piston 122 can be driven by the pressure of the driving fluid. In other words, the driving fluid supply mechanism 131 is configured to drive the second piston 202 to indirectly drive the first piston 122.

Figure 3:
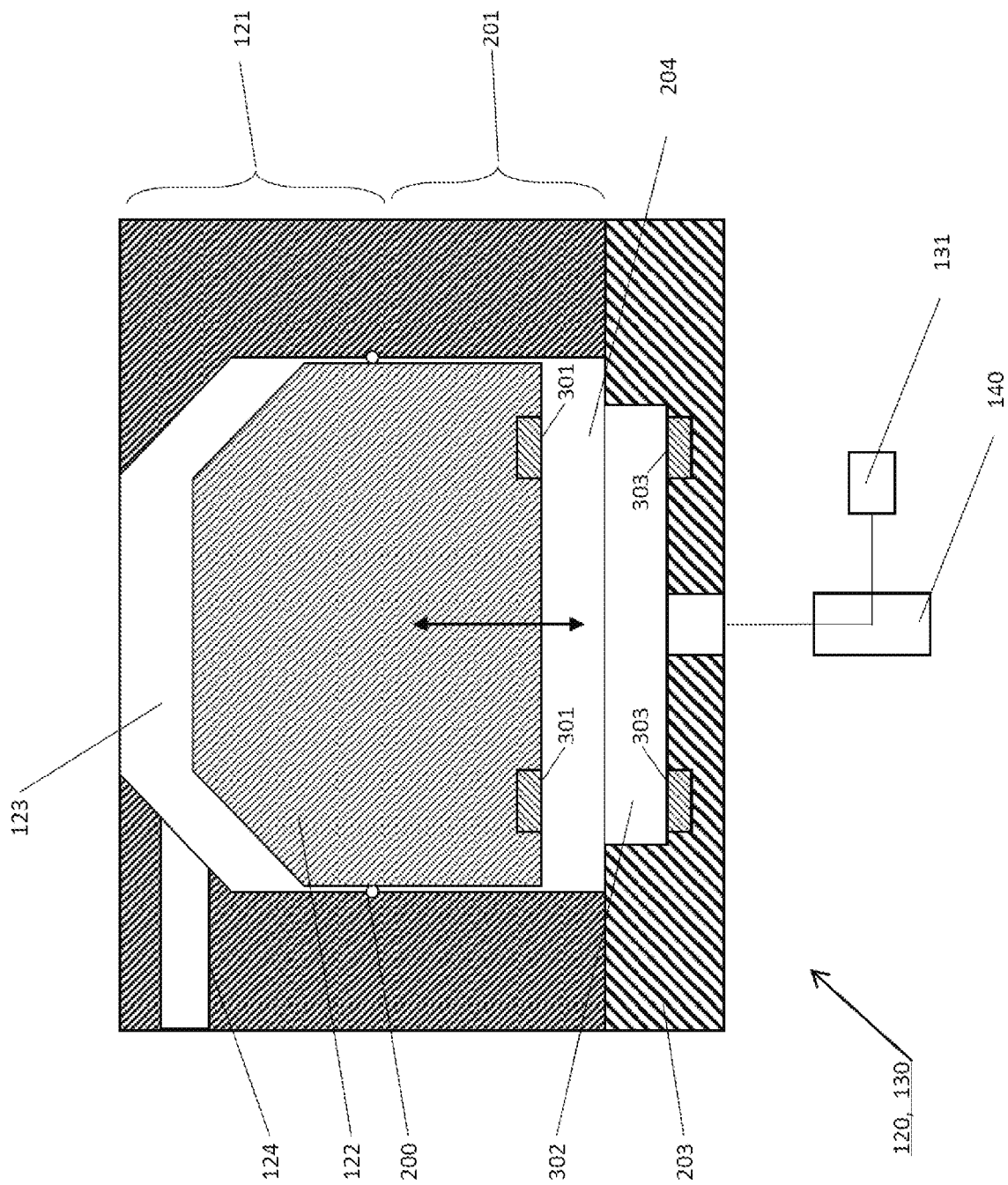
FIG. 3 is a front cross-sectional view illustrating the polishing liquid discharge mechanism and the driving mechanism using a magnet.

As the biasing mechanism, instead of the spring 205 illustrated in FIG. 2, a structure to press down the second piston 202 by a magnetic force can be employed. FIG. 3 is a front cross-sectional view illustrating the polishing liquid discharge mechanism 120 and the driving mechanism 130 using a magnet (ferromagnet). In the example of FIG. 3, a first piston and a second piston are integrally formed, and there is no clear boundary between the first piston and the second piston. Therefore, in the description of the example of FIG. 3, the first piston and the second piston are collectively referred to as a "piston 122." In the example of FIG. 3, a first magnet 301 is disposed to a lower portion of the piston 122. Furthermore, a depressed portion 302 is provided to a part of a top surface of the bottom plate 203, and a second magnet 303 is disposed to the depressed portion 302. In the example of FIG. 3, a magnetic pole of the first magnet 301 and a magnetic pole of the second magnet 303 are oriented so as to generate a magnetic attractive force between the first magnet 301 and the second magnet 303.

In the example of FIG. 3, the piston 122 is driven to a position where a force of the driving fluid to press up the piston 122 is balanced with a force of the attractive force between the first magnet 301 and the second magnet 303 to press down the piston 122. According to this configuration, the piston 122 can be driven without using the spring 205 illustrated in FIG. 2.

Here, the closer the distance between the first magnet 301 and the second magnet 303 becomes, the stronger the magnetic attractive force generated between them becomes. Therefore, when the first magnet 301 contacts the second magnet 303, the magnetic attractive force becomes excessively strong, and the pressure of the driving fluid possibly fails to press up the piston 122. In the example of FIG. 3, since the second magnet 303 is disposed to the depressed portion 302, the first magnet 301 does not contact the second magnet 303 even if the piston 122 is moved to the lowest position. That is, by disposing the second magnet 303 to the depressed portion 302, the generation of the excessively strong magnetic attractive force can be avoided.

The first magnet 301 and the second magnet 303 may be permanent magnets, or may be electromagnets. The material of the first piston 122 may be a magnetic material to use the piston 122 as the first magnet 301. Conversely, the material of the bottom plate 203 may be a magnetic material to use the bottom plate 203 as the second magnet 303. A configuration where a magnetic repulsion force is used to press down the piston 122 can be employed.

Figure 4:
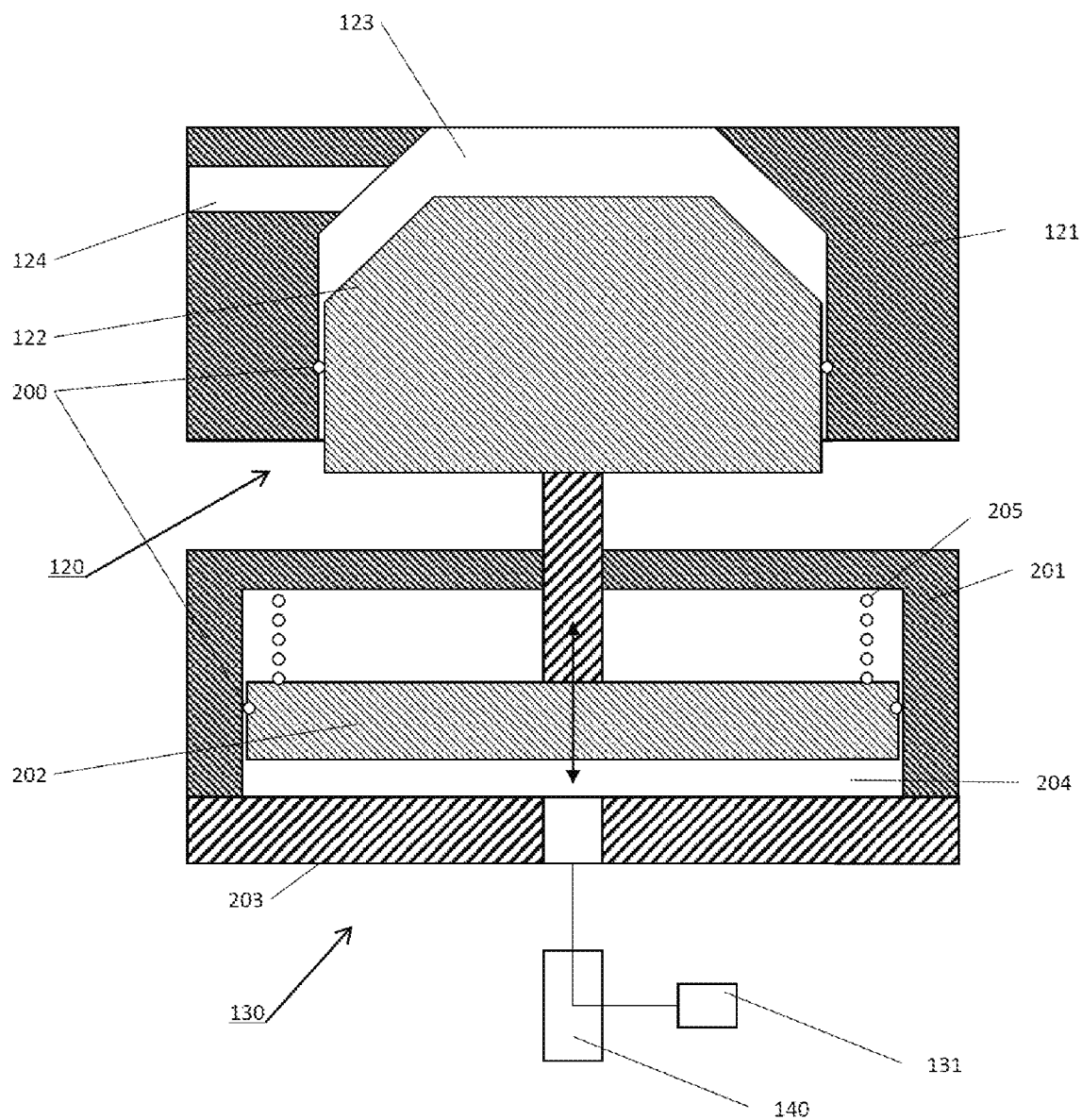
FIG. 4 is a front cross-sectional view of the polishing liquid discharge mechanism and the driving mechanism independent of the polishing liquid discharge mechanism.

Different from FIG. 2, the polishing liquid discharge mechanism 120 and the driving mechanism 130 can be separately configured. FIG. 4 is a front cross-sectional view of the polishing liquid discharge mechanism 120 and the driving mechanism 130 independent of the polishing liquid discharge mechanism. In this example, the first cylinder 121 and the second cylinder 201 are separately formed, and the first piston 122 and the second piston 202 are separately formed. However, the first piston 122 is connected to the second piston 202, and the first piston 122 moves up and down in accordance with the up-and-down motion of the second piston 202. The behaviors of the polishing liquid discharge mechanism 120 and the driving mechanism 130 of FIG. 4 are identical to the behaviors of the polishing liquid discharge mechanism 120 and the driving mechanism 130 illustrated in FIG. 2.

Figure 5:
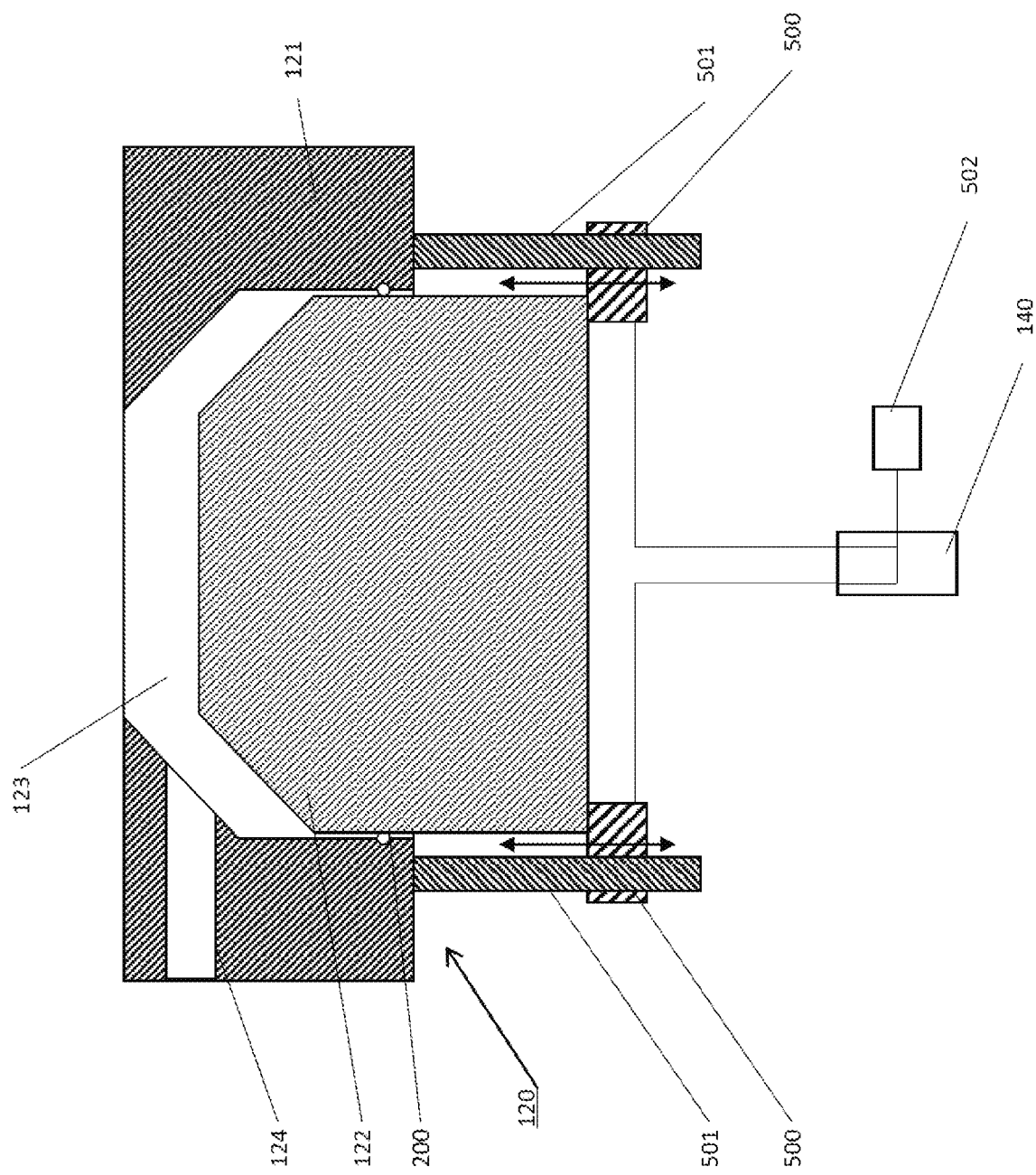
FIG. 5 is a front cross-sectional view of the polishing liquid discharge mechanism and an electric driving mechanism.

The substrate polishing apparatus 10 that uses an electric driving mechanism 500 as the driving mechanism 130 will be described by referring to FIG. 5. FIG. 5 is a front cross-sectional view of the polishing liquid discharge mechanism 120 and the electric driving mechanism 500. To the piston 122 of the polishing liquid discharge mechanism 120 of FIG. 5, at least one (in this example, two) electric driving mechanism 500 is secured. Furthermore, to the cylinder 121 of the polishing liquid discharge mechanism 120 of FIG. 5, at least one (in this example, two) guide 501 is secured. The electric driving mechanism 500 can move up and down along the guide 501. The piston 122 moves up and down in accordance with the up-and-down motion of the electric driving mechanism 500. The power (electric power) of the electric driving mechanism 500 is supplied from a power source 502 via the rotary joint 140. While the electric driving mechanism 500 possibly has a complicated configuration compared with the driving mechanism (see FIG. 2, FIG. 3, and FIG. 4) using the driving fluid, the electric driving mechanism 500 provides an advantage that the electrical control can be performed is provided.

(Effect of Polishing Liquid Discharge Mechanism 120)

According to the above-described configuration, the polishing liquid is held in the liquid holding space 123 of the polishing liquid discharge mechanism 120, and the polishing liquid does not pass through inside the rotary joint 140. Therefore, the degeneration or the abrasion of the components of the rotary joint 140 due to the polishing liquid is not caused. Accordingly, the substrate polishing apparatus 10 according to the embodiment can extend the product life of the rotary joint 140 to reduce maintenance frequency of the rotary joint 140. However, in addition to the configuration of the embodiment, a rotary joint through which the polishing liquid internally passes may be further disposed. Note that the rotary joint 140 of the embodiment can internally include the driving fluid or wiring. However, it is considered that the degeneration or the abrasion of the components of the rotary joint 140 due to the driving fluid or the wiring is significantly small compared with the degeneration or the abrasion due to the polishing liquid.

(Sensor)

The substrate polishing apparatus 10 of FIG. 1 includes a sensor 132 to control the behavior of the driving mechanism 130. In the example of FIG. 1, the sensor 132 is a flowmeter that measures a flow rate of the driving fluid supplied from the driving fluid supply mechanism 131, and is installed to the supply passage 141. As the sensor 132, a pressure gauge that measures the pressure of the driving fluid can be used. Furthermore, when the driving mechanism 130 is the electric driving mechanism 500, an encoder to measure a movement amount of the electric driving mechanism 500 can be employed as the sensor 132.

The sensor 132 is connected to the controller 20. With the control performed by the controller 20 based on the measurement value of the sensor 132, the driving mechanism 130 can be precisely driven. In other words, with the control based on the measurement value of the sensor 132, the discharge of the liquid from the polishing liquid discharge mechanism 120 can be precisely controlled. When the pressure gauge to measure the pressure of the driving fluid is used as the sensor 132, the pressure of a space between the piston 202 and the bottom plate 203 can be detected. When the leakage of the fluid from the portion sealed by the O-ring 200 occurs due to a scratch and the like generated on the O-ring 200 and/or an abutting surface of the O-ring 200, since the pressure of the space between the piston 202 and the bottom plate 203 changes, an abnormality in the sealed portion also can be detected by the sensor 132. Also when the flowmeter is used as the sensor 132, the abnormality in the sealed portion can be detected. These abnormality detections in the sealed portion are performed by the controller 20 (control device).

(Polishing Liquid Filling Mechanism)

The substrate polishing apparatus 10 of FIG. 1 includes a polishing liquid filling mechanism 160 that fills the polishing liquid in the liquid holding space 123. In the example of FIG. 1, the polishing liquid filling mechanism 160 includes an arm 161 and a nozzle 162. The arm 161 is rotatably configured, and by rotating the arm 161, the nozzle 162 can be positioned above the first opening portion 104 of the polishing pad 102. However, the configuration of the polishing liquid filling mechanism 160 is not limited to the configuration illustrated in FIG. 1, and conventionally known any configuration, for example, a configuration where the arm 161 expands and contracts, can be employed.

Figure 6A:
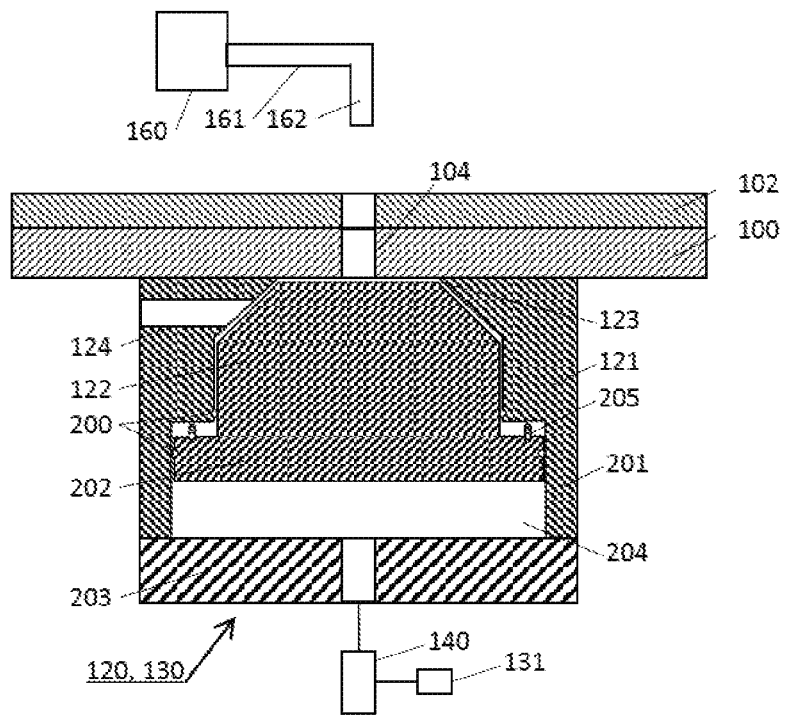
FIG. 6A is a front cross-sectional view of the substrate polishing apparatus before a polishing liquid is filled.

A method for filling the polishing liquid in the liquid holding space 123 using the polishing liquid filling mechanism 160 will be described by referring to FIG. 6. Note that in FIG. 6, illustrations of the components other than the components necessary for describing the method for filling the polishing liquid are omitted in some cases. In FIG. 6, the polishing liquid discharge mechanism 120 and the driving mechanism 130 illustrated in FIG. 2 are used. FIG. 6A is a front cross-sectional view of the substrate polishing apparatus 10 before the polishing liquid is filled, that is, in a state where the piston 122 is completely elevated and the volume of the liquid holding space 123 becomes the lower limit. In this state, the liquid holding space 123 does not hold the polishing liquid at all (or hardly holds the polishing liquid). Accordingly, the polishing liquid needs to be filled in the liquid holding space 123.

Figure 6B:
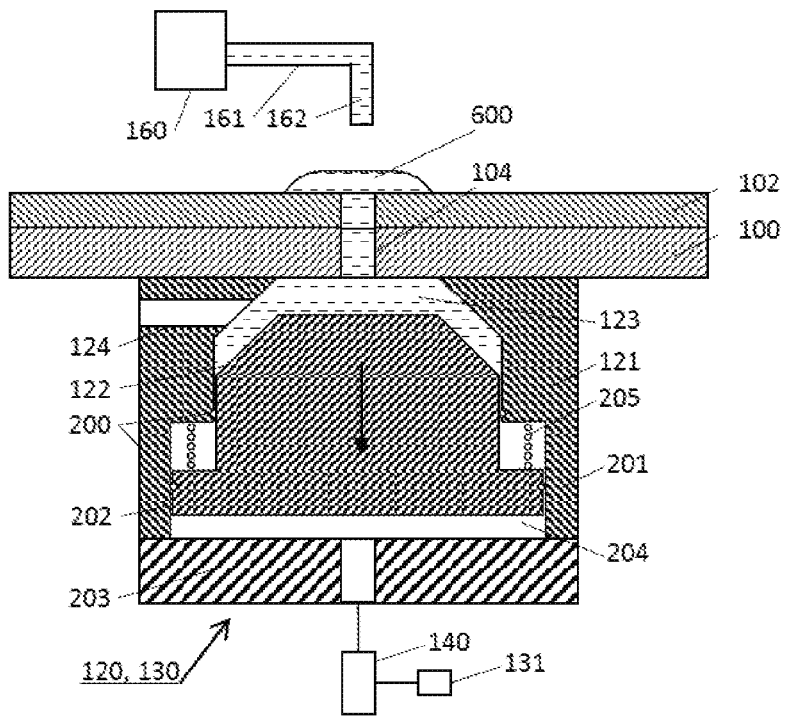
FIG. 6B is a front cross-sectional view of the substrate polishing apparatus during the filling of the polishing liquid.

Therefore, the controller 20 controls the polishing liquid filling mechanism 160 to position the nozzle 162 of the polishing liquid filling mechanism 160 above the first opening portion 104, that is, a position opposing the rotary table, thereby supplying the polishing liquid from the nozzle 162. FIG. 6B is a front cross-sectional view of the substrate polishing apparatus 10 during the filling of a polishing liquid 600. As illustrated in FIG. 6B, the controller 20 controls the driving mechanism 130 to move the piston 122 downward, thereby increasing the volume of the liquid holding space 123.

When the first opening portion 104 has a small diameter, only by supplying the polishing liquid onto the top of the first opening portion 104, the polishing liquid hardly passes through the first opening portion 104. As illustrated in FIG.

6B, by moving the piston 122 downward, the volume of the liquid holding space 123 increases and the polishing liquid is drawn into the liquid holding space 123. Accordingly, the substrate polishing apparatus 10 according to the embodiment facilitates the filling of the polishing liquid 600 in the liquid holding space 123 even when the first opening portion 104 has the small diameter. The control of the driving mechanism 130 is performed after the supply of the polishing liquid 600 or at least a part of the period during the supply of the polishing liquid 600.

Figure 6C:
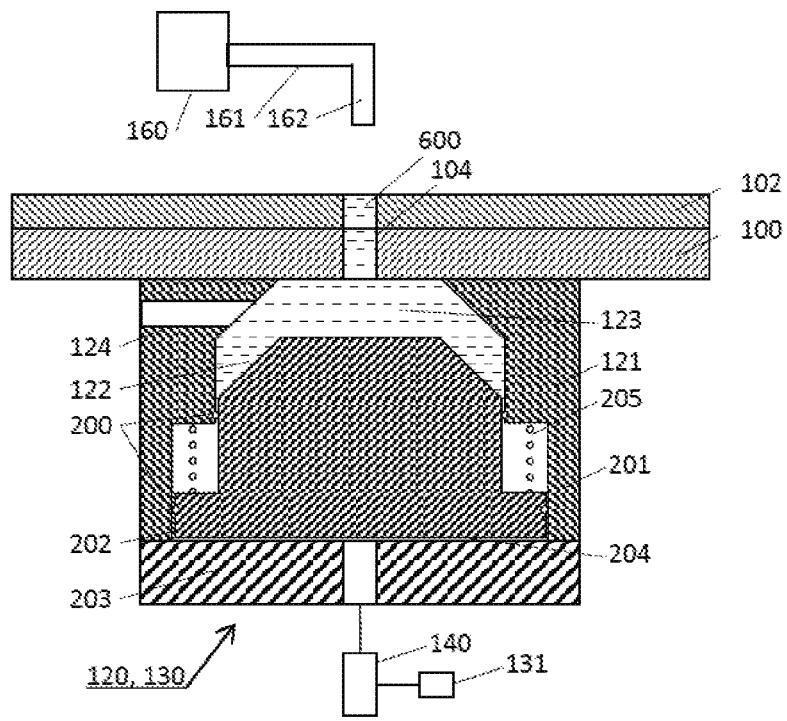
FIG. 6C is a front cross-sectional view of the substrate polishing apparatus after the filling of the polishing liquid.

FIG. 6C is a front cross-sectional view of the substrate polishing apparatus 10 after the filling of the polishing liquid 600. As illustrated in FIG. 6C, the controller 20 stops the driving of the driving mechanism 130 when the volume of the liquid holding space 123 becomes maximum. Note that the driving of the driving mechanism 130 may be stopped when the polishing liquid 600 is filled by a predetermined amount. By the above-described steps, the liquid holding space 123 is filled with the polishing liquid 600.

Figure 6D:
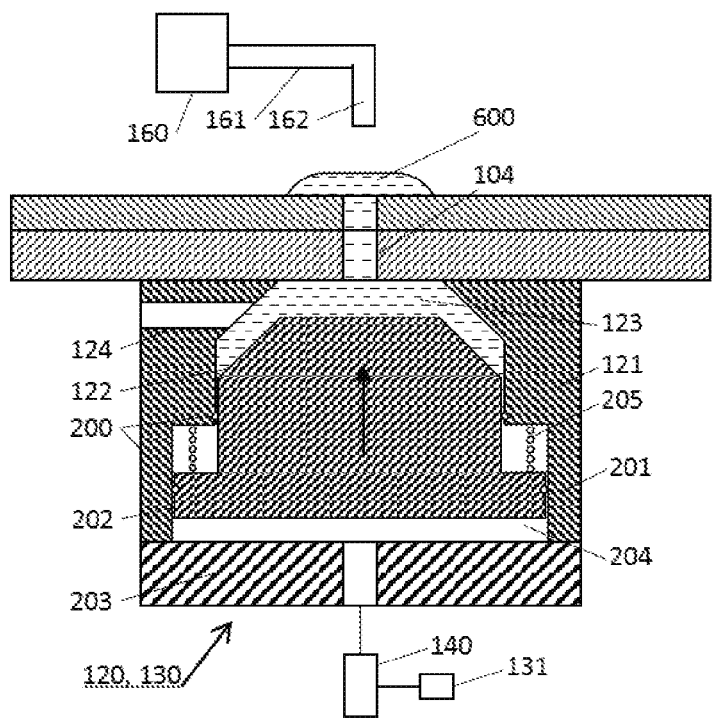
FIG. 6D is a front cross-sectional view of the substrate polishing apparatus during discharge of the polishing liquid.

The filled polishing liquid 600 is discharged from the first opening portion 104 as necessary, for example, when the substrate is polished. FIG. 6D is a front cross-sectional view of the substrate polishing apparatus 10 during the discharge of the polishing liquid 600. As illustrated in FIG. 6D, the discharge of the polishing liquid 600 is performed by increasing the pressure of the driving fluid inside the fluid entering space 204, driving the piston 122 upward, and pressing the polishing liquid 600. By gradually increasing the pressure of the driving fluid, the polishing liquid 600 can be continuously discharged.

Note that the polishing liquid filling mechanism 160 may be configured to supply a liquid other than the polishing liquid. In this case, the liquid other than the polishing liquid can be filled in the liquid holding space 123. The polishing liquid filling mechanism 160 can be used not only for filling the liquid, but also for supplying a liquid, such as the polishing liquid, to the polishing pad 102 during the polishing of the substrate 112.

(Cleaning Liquid Supply Port and Cleaning Liquid Supply Source)

After the termination of the polishing of the substrate 112 in the substrate polishing apparatus 10, to remove process scrap and the like accumulated on the polishing pad 102 and/or the substrate 112, the polishing pad 102 and/or the substrate 112 is cleaned with a cleaning liquid in some cases. Since the cleaning liquid, such as a pure water and a chemical liquid, has a small degree of deterioration in the rotary joint compared with that of the polishing liquid, the cleaning liquid may be supplied to opening portions (not illustrated) provided to a supply line (not illustrated) and the polishing table directly from the rotary joint by passing the cleaning liquid through the rotary joint.

Alternatively, to discharge the cleaning liquid from the first opening portion 104, the polishing liquid discharge mechanism 120 and other components may be configured to hold not only the polishing liquid but also the cleaning liquid. When the cleaning liquid can be supplied from the above-described polishing liquid filling mechanism 160, the cleaning liquid can be filled in the polishing liquid discharge mechanism 120 from the polishing liquid filling mechanism 160. However, when the first opening portion 104 is covered with the substrate 112, it is difficult to fill the cleaning liquid using the polishing liquid filling mechanism 160.

The liquid holding space 123 of the polishing liquid discharge mechanism 120 is communicated with the first opening portion 104. Therefore, the process scrap generated on the polishing pad 102 possibly enters the liquid holding space 123. Furthermore, when the kind of the liquid held in the liquid holding space 123 is changed, mixing the liquids before and after the change is to be avoided. Accordingly, for removing the process scrap or avoiding the mixture of the liquids, a mechanism configured to clean the liquid holding space 123 is preferably disposed.

Then, in the example of FIG. 1, a cleaning liquid supply port 124 communicated with the liquid holding space 123 is disposed on a side portion of the cylinder 121 in the polishing liquid discharge mechanism 120. The cleaning liquid supply port 124 may be disposed so as to penetrate the piston 122 from the bottom portion to the top. Furthermore, the substrate polishing apparatus 10 of the embodiment includes a cleaning liquid supply source 150 connected to the cleaning liquid supply port 124 via the rotary joint 140. In the example of FIG. 1, a cleaning liquid supply line 151 connected to the cleaning liquid supply port 124 is disposed, and the cleaning liquid supply line 151 supplies the cleaning liquid supplied from the cleaning liquid supply source 150 to the liquid holding space 123 passing through the cleaning liquid supply port 124. Note that in the example of FIG. 1, the valve 40 is disposed between the cleaning liquid supply source 150 and the cleaning liquid supply port 124 (that is, on the cleaning liquid supply line 151). A sensor (not illustrated) to measure the flow rate or the pressure of the cleaning liquid may be disposed between the cleaning liquid supply source 150 and the cleaning liquid supply port 124.

With this configuration, filling the cleaning liquid in the liquid holding space 123 is facilitated. The filled cleaning liquid may be used for cleaning the polishing pad 102 and/or the substrate 112, and may be used for cleaning the liquid holding space 123. The cleaning of the polishing pad 102 is performed by discharging the cleaning liquid from the first opening portion 104. At this time, when the substrate 112 is in contact with the polishing pad 102, the substrate 112 is cleaned together with the polishing pad 102. Note that the discharge of the cleaning liquid from the first opening portion 104 can be performed by the pressure of the cleaning liquid supply source. Therefore, while the up-and-down motion of the piston 122 is not required, the up-and-down motion of the piston 122 may be performed for cleaning the liquid holding space 123. The cleaning of the polishing pad 102 and/or the substrate 112 and the cleaning of the liquid holding space 123 by the cleaning liquid may be performed in parallel, or may be performed independently.

(Second Opening Portion)

After termination of the polishing of the substrate 112, to remove the substrate 112 installed to the polishing head 110, the head up-and-down motion mechanism 114 lifts the polishing head 110 and the substrate 112. Here, the substrate 112 sticks to the polishing pad 102 to make difficult to remove the substrate 112 from the polishing pad 102 in some cases.

Therefore, in the example of FIG. 1, the rotary table 100 includes a second opening portion 105. The driving fluid supply mechanism 131 is communicated with the second opening portion 105 by a driving fluid supply line 133, and the driving fluid can be discharged to the top of the rotary table 100. Note that the driving fluid supply line 133 includes the valve 40. The controller 20 controls the head up-and-down motion mechanism 114, the driving fluid supply mechanism 131, and the valve 40 connected to the second opening portion 105 to move the polishing head 110 to upward while discharging the driving fluid from the second opening portion 105. With this control, an upward force is applied to the substrate 112 by the driving fluid, thus facilitating the removal of the substrate 112 from the polishing pad 102. When the driving mechanism 130 is the air pressure system or the water pressure system (when the driving fluid is a gas or a liquid), contamination of the substrate 112 due to the driving fluid is a little, and therefore, the configuration that includes the second opening portion 105 is especially advantageous.

Second Embodiment

The substrate polishing apparatus 10 of the first embodiment includes one first opening portion 104 in the center of the rotary table 100. With this configuration, it is difficult to precisely adjust a distribution of the polishing liquid and the like on the polishing pad 102 in some cases. Therefore, a substrate polishing apparatus 10 according to the second embodiment includes a plurality of first opening portions 104 at the rotary table 100.

The configuration of the plurality of first opening portions 104 will be described by referring to FIGS. 7, 8, and 9. Note that in FIGS. 7, 8, and 9, illustrations of the components other than the components necessary for describing the plurality of first opening portions 104 are omitted in some cases.

FIG. 7A is a front cross-sectional view of the substrate polishing apparatus 10 that includes a rotary table 100 where a plurality of (in this example, three) first opening portions 104A, 104B, and 104C communicated with an identical liquid holding space 123 are provided. The first opening portions 104A, 104B, and 104C each include an independent flow passage. By adjusting positions, flow passage diameters, flow passage lengths, and the like of the respective first opening portions, the discharge of the polishing liquid can be adjusted. The configuration of FIG. 7A is advantageous in that the substrate polishing apparatus 10 of the first embodiment does not need to be significantly changed. Note that it is not necessary that the flow passages of the first opening portions 104A, 104B, and 104C are completely independent. As illustrated in FIG. 7B, the flow passages of the first opening portions may each have a common part.

Figure 8:
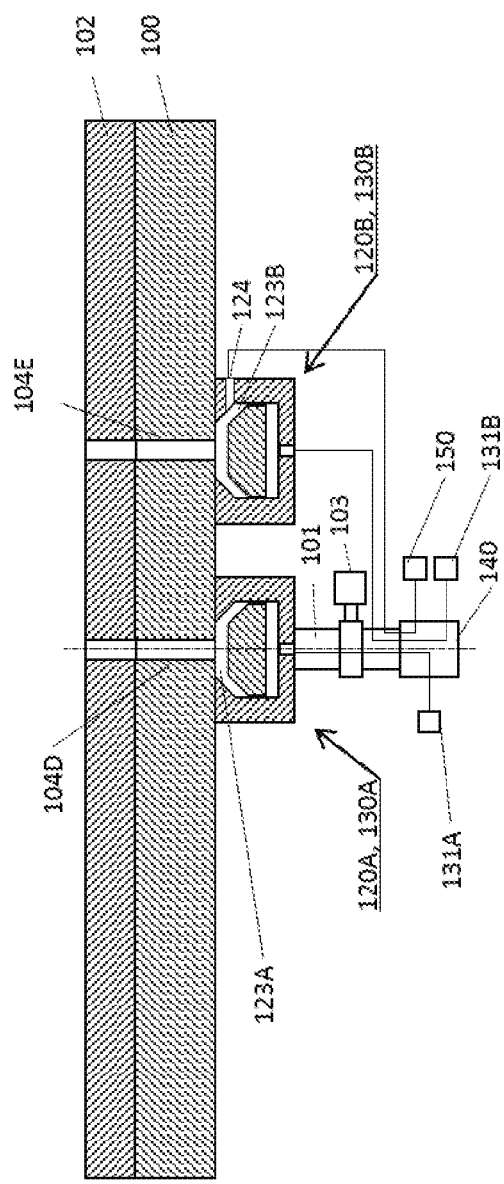
FIG. 8 is a front cross-sectional view of a substrate polishing apparatus that includes a plurality of polishing liquid discharge mechanisms.

FIG. 8 is a front cross-sectional view of the substrate polishing apparatus 10 that includes a plurality of (in this example, two) polishing liquid discharge mechanisms 120A and 120B. The polishing liquid discharge mechanism 120A is disposed in the center of the rotary table 100, and the polishing liquid discharge mechanism 120B is disposed at a position apart from the center of the rotary table 100. The rotary table 100 includes a first opening portion 104D so as to be communicated with a liquid holding space 123A, and includes a first opening portion 104E so as to be communicated with a liquid holding space 123B. To the polishing liquid discharge mechanisms 120A and 120B, driving mechanisms 130A and 130B are connected, respectively. Since the driving mechanisms 130A and 130B are each independently driven, driving fluid supply mechanisms 131A and 131B are disposed. In this method, while the configuration is complicated, it is advantageous in that the polishing liquid discharge mechanisms 120A and 120B can be independently controlled. The driving mechanisms 130A and 130B may use one driving fluid supply mechanism 131 in common. When the polishing liquid discharge mechanism 120A and the polishing liquid discharge mechanism 120B hold the identical polishing liquid to supply, for example, the arm 161 may include a plurality of nozzles 162 to fill the polishing liquid in the liquid holding spaces in a state where the plurality of nozzles are each positioned above the corresponding first opening portion.

The polishing liquid discharge mechanisms 120A and 120B may each hold a different type of liquid. In the example of FIG. 8, the polishing liquid discharge mechanism 120A is a mechanism that holds the polishing liquid and discharges the polishing liquid by the elevation of the piston. When the cleaning of the liquid holding space is not necessary, or when the cleaning of the liquid holding space can be performed by other means, the polishing liquid discharge mechanism 120A does not need to include the cleaning liquid supply port 124. However, the polishing liquid discharge mechanism 120A may include the cleaning liquid supply port 124. Meanwhile, in the example of FIG. 8, the polishing liquid discharge mechanism 120B is a mechanism that holds the cleaning liquid and discharges the cleaning liquid by the elevation of the piston. Therefore, the polishing liquid discharge mechanism 120B includes the cleaning liquid supply port 124 connected to the cleaning liquid supply source 150. The configuration whose example is illustrated in FIG. 8 ensures the precise control corresponding to the type of the liquid.

Figure 9A:
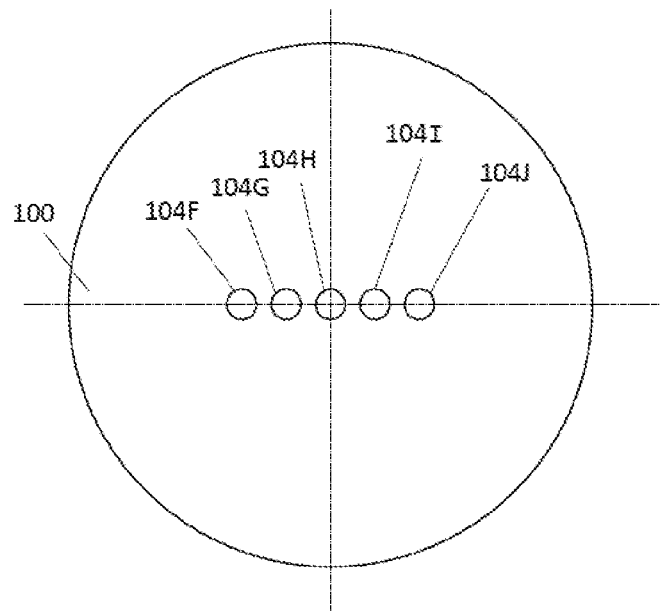
FIG. 9A is a top view of a rotary table where five first opening portions are provided.
Figure 9B:
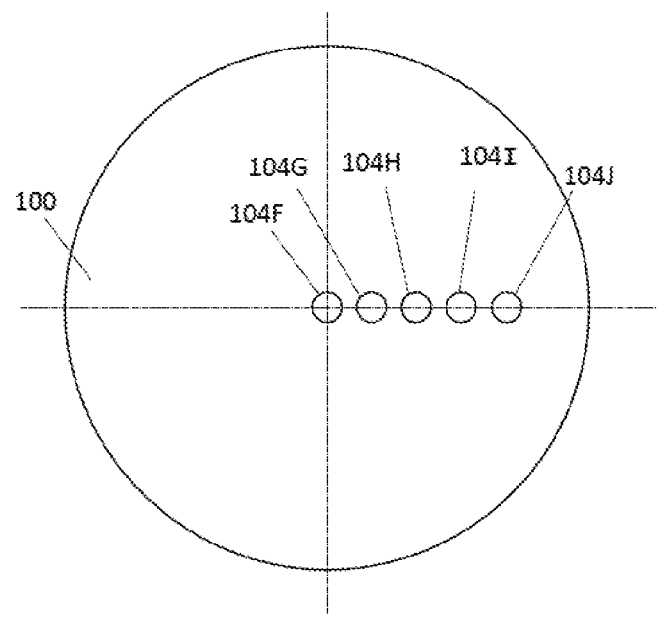
FIG. 9B is a top view of the rotary table where the five first opening portions are provided.

FIG. 9 includes top views of the rotary table 100 where a plurality of (in this example, five) first opening portions 104F, 104G, 10411, 1041, and 104J are provided. As illustrated in FIG. 9A, the first opening portions 104F to 104J may be arranged axially symmetric on a straight line passing through the center of the rotary table 100. As illustrated in FIG. 9B, the first opening portions 104F to 104J may be arranged in one direction having the center of the rotary table 100 as a starting point on the straight line passing through the center of the rotary table 100. Furthermore, as illustrated in FIG. 9C, the first opening portions 104F to 104J may be arranged on a concentric circle viewed from the center of the rotary table 100. In addition, any number of first opening portions 104 can be disposed at any positions depending on a desired performance.

Third Embodiment

Constant discharge of the liquid, such as the polishing liquid, from the first opening portion 104 provided to the rotary table 100 possibly increases consumption quantity of the liquid. In the polishing liquid discharge mechanism 120 described above, since the volume of the liquid holding space 123 is limited, consumption quantity of the liquid is preferably reduced. Therefore, a controller 20 of a substrate polishing apparatus 10 of the third embodiment performs a control where the volume of a liquid holding space 123 is decreased by a driving mechanism 130 when the substrate 112 covers the first opening portion 104, and the driving of the driving mechanism 130 is stopped when the substrate 112 does not cover the first opening portion 104.

This embodiment will be described by referring to FIG. 10. FIG. 10 includes top views of the rotary table 100 and the substrate 112. In the example of FIG. 10, the substrate 112 has a polygonal shape. The configuration of the substrate polishing apparatus 10 in the example of FIG. 10 is identical to the configuration of FIG. 8. That is, the rotary table 100 includes two first opening portions 104D and 104E, and polishing liquid discharge mechanisms 120A and 120B are disposed at lower portions of the respective first opening portions. In the example of FIG. 10, the rotary table 100 and the polishing head 110 (not illustrated in FIG. 10) each rotate at an identical rotation speed in an identical direction. FIGS. 10B, 10C, and 10D are top views of the rotary table 100 and the substrate 112 at time points where the rotary table 100 and the polishing head 110 are each rotated counterclockwise from the state of FIG. 10A by 45 degrees, 90 degrees, and 135 degrees.

Figure 10A:
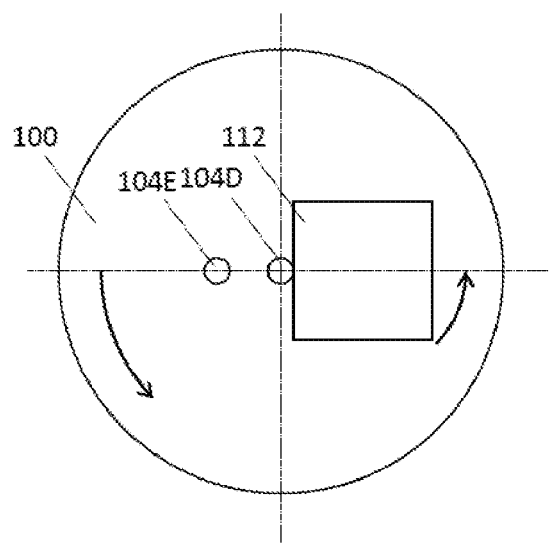
FIG. 10A is a top view of the rotary table and a polygonal substrate.
Figure 10B:
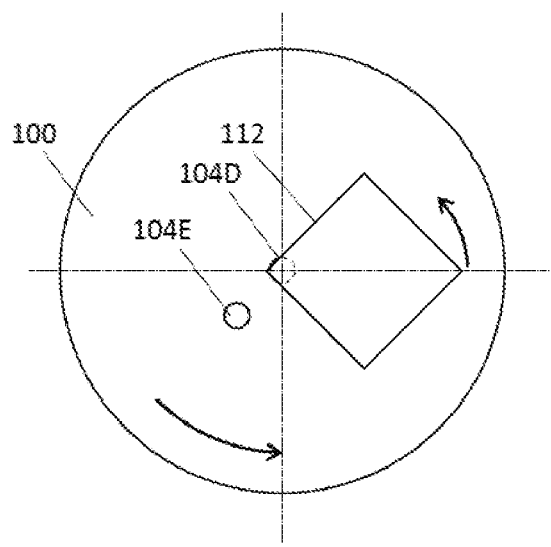
FIG. 10B is a top view of the rotary table and the polygonal substrate.
Figure 10C:
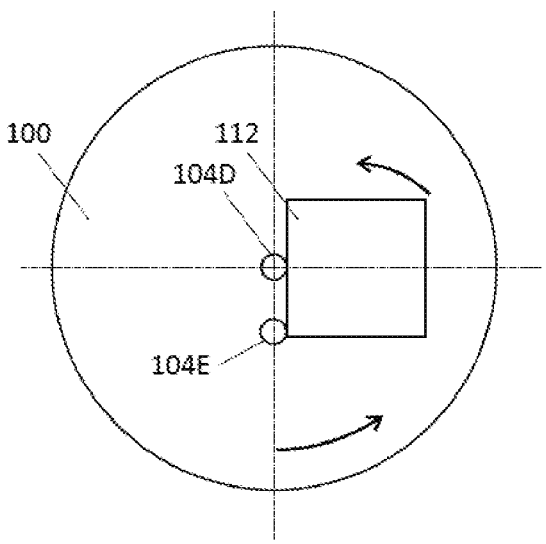
FIG. 10C is a top view of the rotary table and the polygonal substrate.
Figure 10D:
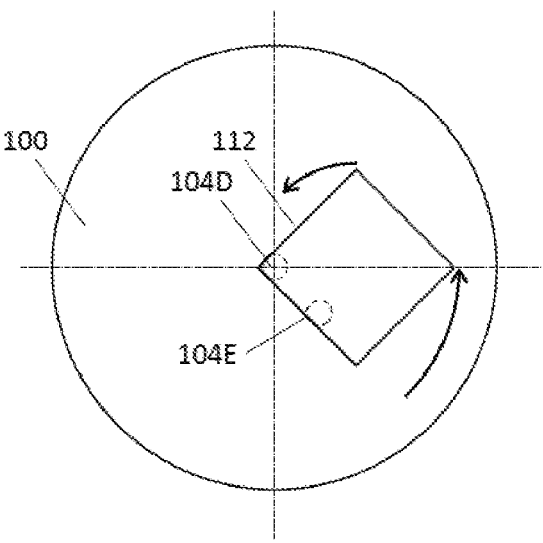
FIG. 10D is a top view of the rotary table and the polygonal substrate.

At the time point of FIG. 10A, both the first opening portion 104D and the first opening portion 104E are not covered with the substrate 112. Therefore, the controller 20 performs the control to stop the driving of the driving mechanism 130A and the driving mechanism 130B to avoid the discharge of the liquid from the first opening portion 104D and the first opening portion 104E.

At the time point of FIG. 10B, the first opening portion 104D is covered with the substrate 112, but the first opening portion 104E is not covered with the substrate 112. Therefore, the controller 20 performs the control of the driving mechanism 130A to decrease the volume of the liquid holding space 123A of the polishing liquid discharge mechanism 120A disposed at the lower portion of the first opening portion 104D. Meanwhile, the driving mechanism 130B is controlled not to be driven. Thus, the liquid is discharged from the first opening portion 104D, but the liquid is not discharged from the first opening portion 104E.

At the time point of FIG. 10C, similarly to FIG. 10A, both the first opening portion 104D and the first opening portion 104E are not covered with the substrate 112. Therefore, the controller 20 performs the control to stop the driving of the driving mechanism 130A and the driving mechanism 130B.

At the time point of FIG. 10D, both the first opening portion 104D and the first opening portion 104E are covered with the substrate 112. Therefore, the controller 20 performs the control of the driving mechanism 130A and the driving mechanism 130B to decrease the volumes of both the liquid holding spaces 123A and 123B. Thus, the liquid is discharged from both the first opening portion 104D and the first opening portion 104E.

With the above-described control, since the liquid is discharged from the first opening portion only when the first opening portion 104 is covered with the substrate 112, the consumption quantity of the liquid can be reduced. The controller 20 may control the discharge of the liquid from each first opening portion depending on the rotation speeds of the rotary table 100 and the polishing pad 102, the number and the position of the first opening portion 104, the shape and the position of the substrate 112, and the like. Whether the first opening portion 104 is covered with the substrate 112 or not can be determined by a not illustrated sensor (for example, optical sensor or pressure-sensitive sensor). Whether the first opening portion 104 is covered with the substrate 112 or not can be calculated from, for example, the rotation speeds of the rotary table 100 and the polishing pad 102, the number and the position of the first opening portion 104, the shape and the position of the substrate 112, and the like. In this case, the storage 30 may store a liquid discharge pattern derived from the calculation result. The controller 20 reads the liquid discharge pattern from the storage 30 to ensure the control of the driving mechanism 130 based on the liquid discharge pattern.

The liquid discharge pattern can be determined in consideration of not only whether the first opening portion 104 is covered with the substrate 112 or not, but also other elements. For example, when a polishing amount increases only at the edge portion of the substrate 112, the controller 20 may control the driving mechanism 130 so as to decrease the supply amount of the polishing liquid when the first opening portion 104 is covered with the edge portion of the substrate 112. Meanwhile, when the substrate 112 has a part where the polishing is insufficient, the driving mechanism 130 can be controlled so as to supply more polishing liquid to the part. In addition, the liquid discharge patterns corresponding to various conditions are employable.

Some embodiments of the present invention have been described above in order to facilitate understanding of the present invention without limiting the present invention. The present invention can be changed or improved without departing from the gist thereof, and of course, the equivalents of the present invention are included in the present invention. For example, while the substrate polishing apparatus 10 has been described as a device to polish only one substrate, the substrate polishing apparatus 10 may be a device to simultaneously polish a plurality of substrates. The substrate polishing apparatus 10 may be a device (face-up type device) where the polishing surface of the substrate 112 faces vertically upward, or may be a device where the polishing surface of the substrate 112 faces the horizontal direction. The substrate polishing apparatus 10 is not limited to the CMP apparatus.

It is possible to arbitrarily combine or omit respective components according to claims and description in a range in which at least a part of the above-described problems can be solved, or a range in which at least a part of the effects can be exhibited.

REFERENCE SIGNS LIST

10 . . . substrate polishing apparatus
20 . . . controller
30 . . . storage
40 . . . valve
100 . . . rotary table
101 . . . table rotation shaft
102 . . . polishing pad
103 . . . table rotation mechanism
104 . . . first opening portion
105 . . . second opening portion
110 . . . polishing head
111 . . . head rotation shaft
112 . . . substrate
113 . . . head rotation mechanism
114 . . . head up-and-down motion mechanism
120 . . . polishing liquid discharge mechanism
121 . . . cylinder
122 . . . piston
123 . . . liquid holding space
124 . . . cleaning liquid supply port
130 . . . driving mechanism
131 . . . driving fluid supply mechanism
132 . . . sensor
133 . . . driving fluid supply line
140 . . . rotary joint
141 . . . supply passage
142 . . . discharge passage
150 . . . cleaning liquid supply source
151 . . . cleaning liquid supply line
160 . . . polishing liquid filling mechanism
161 . . . arm
162 . . . nozzle
200 . . . O-ring
201 . . . second cylinder
202 . . . second piston
203 . . . bottom plate
204 . . . fluid entering space
205 . . . spring
301 . . . first magnet
302 . . . depressed portion
303 . . . second magnet 500 . . . electric driving mechanism
501 . . . guide
502 . . . power source
600 . . . polishing liquid

The invention claimed is:
1. A substrate polishing apparatus comprising:
a polishing head for holding a substrate;
a rotary table that has a surface to which a first opening portion is provided;
a polishing liquid discharge mechanism disposed to the rotary table; and
a controller configured to control at least the polishing liquid discharge mechanism, wherein
the polishing liquid discharge mechanism includes:
a first cylinder;
a first piston; and
a driving mechanism that drives the first piston,
the first opening portion is communicated with a liquid holding space defined by the first cylinder and the first piston, and
the controller configured to control the driving of the first piston by the driving mechanism to increase and decrease a volume of the liquid holding space,
wherein the driving mechanism includes a driving fluid supply mechanism configured to drive the first piston by a pressure of a driving fluid.

2. The substrate polishing apparatus according to claim 1, comprising
a polishing liquid filling mechanism for filling a polishing liquid in the liquid holding space via the first opening portion.

3. The substrate polishing apparatus according to claim 1, wherein
the driving mechanism includes:
a second cylinder; and
a second piston connected to the first piston, and
the driving fluid supply mechanism is configured to drive the second piston by the pressure of the driving fluid to indirectly drive the first piston.

4. The substrate polishing apparatus according to claim 1, wherein
the driving fluid is a gas or a liquid.

5. The substrate polishing apparatus according to claim 1, comprising
a biasing mechanism that biases the first piston in an opposite direction of a direction in which the first piston is driven when the pressure of the driving fluid is increased.

6. The substrate polishing apparatus according to claim 5, wherein
the biasing mechanism is a spring.

7. The substrate polishing apparatus according to claim 1, wherein
the driving fluid is a gas or a liquid,
the substrate polishing apparatus further includes:
a head up-and-down motion mechanism for pressing the substrate toward the rotary table;
a second opening portion provided to the surface of the rotary table;
a driving fluid supply line that communicates the driving fluid supply mechanism with the second opening portion; and
a valve disposed on the driving fluid supply line, the valve being controlled by the controller, and
the controller configured to control the valve to discharge the driving fluid from the second opening portion when the head up-and-down motion mechanism moves the polishing head upward.

8. The substrate polishing apparatus according to claim 1, comprising
a sensor configured to measure a flow rate of the driving fluid or the pressure of the driving fluid, wherein
the controller configured to control the driving mechanism based on a measurement value of the sensor.

9. A substrate polishing apparatus comprising:
a polishing head for holding a substrate;
a rotary table that has a surface to which a first opening portion is provided;
a polishing liquid discharge mechanism disposed to the rotary table; and
a controller configured to control at least the polishing liquid discharge mechanism, wherein
the polishing liquid discharge mechanism includes:
a first cylinder;
a first piston; and
a driving mechanism that drives the first piston,
the first opening portion is communicated with a liquid holding space defined by the first cylinder and the first piston, and
the controller configured to control the driving of the first piston by the driving mechanism to increase and decrease a volume of the liquid holding space,
wherein the driving mechanism includes an electric driving mechanism.

10. A substrate polishing apparatus comprising:
a polishing head for holding a substrate;
a rotary table that has a surface to which a first opening portion is provided;
a polishing liquid discharge mechanism disposed to the rotary table; and
a controller configured to control at least the polishing liquid discharge mechanism, wherein
the polishing liquid discharge mechanism includes:
a first cylinder;
a first piston; and
a driving mechanism that drives the first piston,
the first opening portion is communicated with a liquid holding space defined by the first cylinder and the first piston, and
the controller configured to control the driving of the first piston by the driving mechanism to increase and decrease a volume of the liquid holding space,
the substrate polishing apparatus further comprising:
a rotary joint connected to the driving mechanism, wherein
a power is supplied to the driving mechanism via the rotary joint.

11. A substrate polishing apparatus comprising:
a polishing head for holding a substrate;
a rotary table that has a surface to which a first opening portion is provided;
a polishing liquid discharge mechanism disposed to the rotary table; and
a controller configured to control at least the polishing liquid discharge mechanism, wherein
the polishing liquid discharge mechanism includes:
a first cylinder;
a first piston; and
a driving mechanism that drives the first piston, the first opening portion is communicated with a liquid holding space defined by the first cylinder and the first piston, and the controller configured to control the driving of the first piston by the driving mechanism to increase and decrease a volume of the liquid holding space, wherein the polishing liquid discharge mechanism includes a cleaning liquid supply port communicated with the liquid holding space, and the substrate polishing apparatus further includes a cleaning liquid supply line connected to the cleaning liquid supply port, the cleaning liquid supply line configured to supply a cleaning liquid to the liquid holding space passing through the cleaning liquid supply port, and the cleaning liquid is supplied from a cleaning liquid supply source.

12. The substrate polishing apparatus according to claim 1, wherein
the rotary table is provided with a plurality of the first opening portions communicated with the identical liquid holding space.

13. The substrate polishing apparatus according to claim 1, wherein
a plurality of the polishing liquid discharge mechanisms are disposed.

14. A substrate polishing apparatus comprising:
a polishing head for holding a substrate;
a rotary table that has a surface to which a first opening portion is provided;
a polishing liquid discharge mechanism disposed to the rotary table; and
a controller configured to control at least the polishing liquid discharge mechanism, wherein
the polishing liquid discharge mechanism includes:
a first cylinder;
a first piston; and
a driving mechanism that drives the first piston,
the first opening portion is communicated with a liquid holding space defined by the first cylinder and the first piston, and
the controller configured to control the driving of the first piston by the driving mechanism to increase and decrease a volume of the liquid holding space,
the substrate polishing apparatus further includes a storage configured to store a liquid discharge pattern, and
the controller controls the driving mechanism based on the liquid discharge pattern.

15. A substrate polishing apparatus comprising:
a polishing head for holding a substrate;
a rotary table that has a surface to which a first opening portion is provided;
a polishing liquid discharge mechanism disposed to the rotary table; and
a controller configured to control at least the polishing liquid discharge mechanism, wherein
the polishing liquid discharge mechanism includes:
a first cylinder;
a first piston including a magnetic material;
a bottom plate including a magnetic material; and
a driving mechanism that drives the first piston,
the first opening portion is communicated with a liquid holding space defined by the first cylinder and the first piston, and
the controller configured to control the driving of the first piston by the driving mechanism to increase and decrease a volume of the liquid holding space.

* * * * *